United States Patent
Bruennert et al.

(10) Patent No.: US 7,848,153 B2
(45) Date of Patent: Dec. 7, 2010

(54) HIGH SPEED MEMORY ARCHITECTURE

(75) Inventors: Michael Bruennert, Munich (DE); Peter Gregorius, Munich (DE); Georg Braun, Holzkirchen (DE); Andreas Gaertner, Munich (DE); Hermann Ruckerbauer, Moos (DE); George William Alexander, Durham, NC (US); Johannes Stecker, Munich (DE)

(73) Assignee: Qimonda AG, Munich (DE)

( * ) Notice: Subject to any disclaimer, the term of this patent is extended or adjusted under 35 U.S.C. 154(b) by 186 days.

(21) Appl. No.: 12/194,414

(22) Filed: Aug. 19, 2008

(65) Prior Publication Data
US 2010/0046266 A1 Feb. 25, 2010

(51) Int. Cl.
*G11C 16/06* (2006.01)
(52) U.S. Cl. .................. 365/185.25; 365/222; 365/164; 365/194; 365/51; 365/63
(58) Field of Classification Search ............ 365/185.25, 365/164, 194, 222, 51, 63
See application file for complete search history.

(56) References Cited

U.S. PATENT DOCUMENTS

| | | | |
|---|---|---|---|
| 5,880,987 A | 3/1999 | Merritt | |
| 6,237,130 B1 * | 5/2001 | Soman et al. | 716/10 |

* cited by examiner

*Primary Examiner*—Hoai V Ho
*Assistant Examiner*—Jason Lappas
(74) *Attorney, Agent, or Firm*—Slater & Matsil, L.L.P.

(57) ABSTRACT

Memory devices and memory modules are disclosed. In one embodiment, a memory device includes a semiconductor substrate having a first edge and a second edge opposed to the first edge. A plurality of memory banks is disposed at a central portion of the semiconductor substrate, each memory bank including a plurality of memory cells. A plurality of input/output contacts is disposed between the first edge and the memory banks. Delay locked loop circuitry is disposed adjacent the first edge. A plurality of address and command contacts is disposed between the second edge and the memory banks.

30 Claims, 8 Drawing Sheets

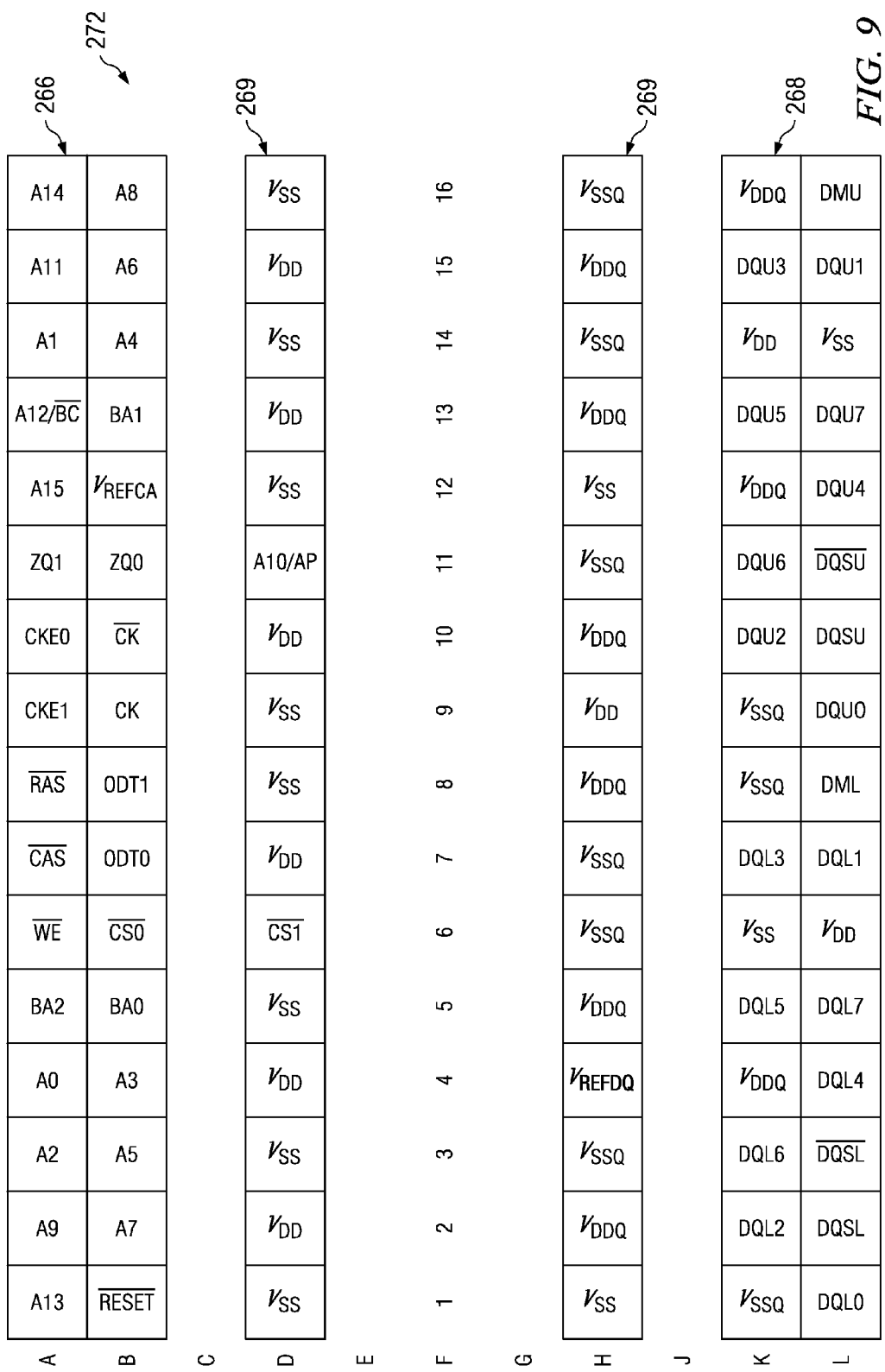

| A | B | C | # | G | H | J |
|---|---|---|---|---|---|---|
| A14 | A8 | $V_{SS}$ | 16 | DMU | $V_{DDQ}$ | $V_{SSQ}$ |
| A11 | A6 | $V_{DD}$ | 15 | DQU1 | DQU3 | $V_{DDQ}$ |
| A1 | A4 | $V_{SS}$ | 14 | $V_{SS}$ | $V_{DD}$ | $V_{SSQ}$ |
| A12/$\overline{BC}$ | BA1 | $V_{DD}$ | 13 | DQU7 | DQU5 | $V_{DDQ}$ |
| A15 | $V_{REFCA}$ | $V_{SS}$ | 12 | DQU4 | $V_{DDQ}$ | $V_{SS}$ |
| ZQ1 | ZQ0 | A10/AP | 11 | $\overline{DQSU}$ | DQU6 | $V_{SSQ}$ |
| CKE0 | $\overline{CK}$ | $V_{DD}$ | 10 | DQSU | DQU2 | $V_{DDQ}$ |
| CKE1 | CK | $V_{SS}$ | 9 | DQU0 | $V_{SSQ}$ | $V_{DD}$ |
| $\overline{RAS}$ | ODT1 | $V_{SS}$ | 8 | DML | $V_{SSQ}$ | $V_{DDQ}$ |
| $\overline{CAS}$ | ODT0 | $V_{DD}$ | 7 | DQL1 | DQL3 | $V_{SSQ}$ |
| $\overline{WE}$ | $\overline{CS0}$ | $\overline{CS1}$ | 6 | $V_{DD}$ | $V_{SS}$ | $V_{SSQ}$ |
| BA2 | BA0 | $V_{SS}$ | 5 | DQL7 | DQL5 | $V_{DDQ}$ |
| A0 | A3 | $V_{DD}$ | 4 | DQL4 | $V_{DDQ}$ | $V_{REFDQ}$ |
| A2 | A5 | $V_{SS}$ | 3 | $\overline{DQSL}$ | DQL6 | $V_{SSQ}$ |
| A9 | A7 | $V_{DD}$ | 2 | DQSL | DQL2 | $V_{DDQ}$ |
| A13 | $\overline{RESET}$ | $V_{SS}$ | 1 | DQL0 | $V_{SSQ}$ | $V_{SS}$ |

HIGH SPEED MEMORY ARCHITECTURE

TECHNICAL FIELD

This invention relates generally to electronic systems, and, in particular embodiments, to a high speed memory architecture.

BACKGROUND

Memory devices are used in many applications, such as computers, calculators, and cellular phones, as examples. Memory devices may be non-volatile or static, or they may be dynamic, requiring refreshing periodically. One type of dynamic memory device is a dynamic random access memory (DRAM) device, in which bits of data are stored in capacitors of an integrated circuit. DRAM devices are often arranged in square or rectangular arrays of memory cells, each having one capacitor and one transistor. DRAM devices may be thousands of cells in length and width, and may comprise millions of cells on a single DRAM chip.

FIG. 1 illustrates a known DRAM chip 100 architecture. The DRAM chip 100 includes a substrate having eight memory banks 102, e.g., bank0 through bank7. Each memory bank 102 comprises a number of memory cells 104, including cell 104a and 104b in bank 0 and bank6, respectively. Control signal pads 106 and input/output pads 108 are formed on a central spine 110 of the DRAM chip 100 between the memory banks 102. The DRAM chip 100 has a mixture of a number of control signal pads 106 and data input/output pads 108 located in the same central spine 110 region of the chip 100. The length dimension $d_1$ of the DRAM chip 100 may be about 12-22 mm, and the height dimension $d_2$ of the DRAM chip 100 may be about 9-10 mm, as examples. The central spine 110 may have a width dimension $d_3$ of about 0.2-0.6 mm, for example.

To read or write to one of the memory cells 104 in the memory banks 102, control signals are input to control signal pads 106, and the information is read from or written to a memory cell 104. For example, to read a memory cell 104a in memory bank 102 of bank0, a control signal 112a (e.g., a CMD/ADDRESS) is sent from a control signal pad 106 in the central spine 110 to the cell 104a. The state of the cell 104a is read, and the information is returned as a data signal 114a to the central spine 110 and along the central spine 110 to a data output pad 108 on the right edge of the DRAM chip 100. Likewise, to read a memory cell 104b in a memory bank 102 of bank6, a control signal 112b is sent from a control signal pad 106 in the central spine 110 to the memory cell 104b. The state of the memory cell 104b is read, and the information is returned as a data signal 114b to the central spine 110 and along the central spine 110 to the data input/output pad 108 on the right edge of the DRAM chip 100.

A problem with the DRAM chip 100 architecture shown in FIG. 1 is that the speed of accessing the memory cells 104 varies depending on the location of the memory banks 102 and the location of the memory cells 104 within the memory banks 102. For example, accessing memory cell 104b is much faster than accessing memory cell 104a because the access length is smaller. The worst case total access length to access memory cell 104a in bank0 is about $(1.5*d_1+d_2)$, and the best case total access length to access memory cell 104b in bank6 is about $(0.5*d_1)$ for the DRAM chip 100 shown. The difference in the worst and best case total access length of the DRAM chip 100 is about $(d_1+d_2)$.

Thus, the DRAM chip 100 architecture has several disadvantages, including a large worst case access length and a large total access time. There also is a large difference between the worst case and best case total access length, which requires a large effort in other portions of the DRAM chip 100 to compensate for the difference in the worst case and best case total access length. The compensation circuitry may include a latency counter that requires high power consumption, for example.

FIG. 2 is a perspective view and FIG. 3 is a top view of a known board-on-chip (BOC) 120 packaging technique for a DRAM chip 100 shown in FIG. 1. The DRAM chip 100 is placed face down and is coupled to a substrate 122 or board having a slot 124 therein. The slot 124 is an aperture in the substrate 122 allowing access to the center spine 110 of the DRAM chip 100 that contains the address and control signal bond pads 106 and the data input/output bond pads 108. The substrate 122 includes a number of bond pads 126 at two edges of the slot 124, as shown in FIG. 3. (For simplicity, the bond pads and solder balls are not illustrated in FIG. 2.) The bond pads 106/108 of the DRAM chip 100 are attached to the bond pads 126 of the substrate 122 using bond wires 130 that extend through the slot 124 in the substrate 122. The substrate 122 includes a number of solder balls 128 to which the bond pads 126 are electrically coupled to using conductive traces or wiring (not shown) in or on the substrate 122.

Next generation high speed memory products are expected to operate at frequencies that cannot be handled using known memory design architectures such as those shown in FIGS. 1 through 3. The data path routing on the DRAM chip 100, on the package 120, and on memory modules on which the package 120 is mounted are too long and lack load matching, which limits the bandwidth.

Thus, what are needed in the art are improved memory chip architectures and packaging techniques.

SUMMARY OF THE INVENTION

Embodiments of the present invention provide technical advantages by providing novel memory devices and memory modules having optimized stub lengths and more consistent access time to the memory cells. The memory devices comprise a novel high speed architecture with input/output contacts at one edge of a DRAM chip and address and command contacts at an opposite edge of the chip, minimizing the stub length on packaging for the DRAM chip.

In one embodiment, a memory device includes a semiconductor substrate having a first edge and a second edge opposed to the first edge. A plurality of memory banks is disposed in or on the semiconductor substrate, each memory bank including a plurality of memory cells. A plurality of input/output contacts is disposed between the first edge and the memory banks. Delay locked loop circuitry is disposed adjacent the first edge. A plurality of address and command contacts is disposed between the second edge and the memory banks.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 illustrates a ballout for solder balls on a substrate of the packaged DRAM chip shown in FIG. 7 implemented in a DIMM;

FIG. 12 is a drawing illustrating a ballout for solder balls on a substrate for the packaged DRAM chips shown in FIG. 11;

Corresponding numerals and symbols in the different figures generally refer to corresponding parts unless otherwise indicated. The figures are drawn to clearly illustrate the relevant aspects of the preferred embodiments of the present invention and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention achieve technical advantages by providing a high speed memory device architecture that reduces worst case access length, increasing the speed of the memory device. Bond pads for control signals are placed at one edge, and bond pads for data and command signals are placed at an opposite edge, resulting in minimizing the length of stub traces on packaging for the memory chips and reducing the worst case access length. The reduced worst case access length also reduces the spread or difference between worst case and best case access lengths, resulting in the ability to use simpler compensation circuits that require less power. The novel high speed memory architecture shortens data bus stub lengths and optimizes DIMM routing. Placing the bond pads at the edges of the memory chips allows for more efficient and better optimized packaging designs.

The present invention will be described with respect to preferred embodiments in a specific context, namely in memory devices and memory modules comprising DRAM devices. The invention may also be applied, however, to other types of memory devices, such as static random access memories (SRAMs) or other types.

Figure 4:
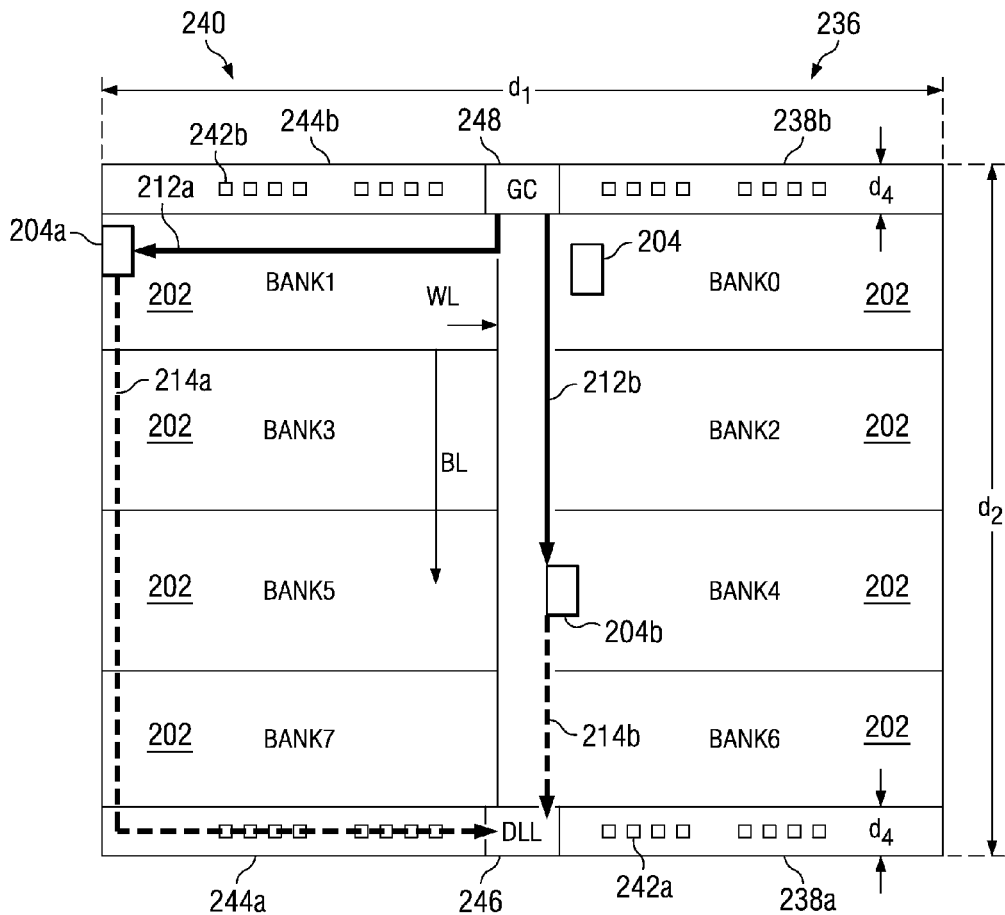
FIG. 4 is a drawing illustrating a DRAM chip architecture in accordance with an embodiment of the present invention.

FIG. 4 illustrates a DRAM chip 240 architecture in accordance with an embodiment of the present invention. The DRAM chip 240 comprises a memory device that is formed on a semiconductor substrate 236. The substrate 236 comprises a workpiece or body comprising silicon, a compound semiconductor such as GaAs, InP, Si/Ge, or SiC, or other semiconductor materials, for example.

The substrate 236 includes a plurality of memory banks 202 formed thereon, e.g., comprising eight banks bank0 through bank7 in the embodiment shown. Alternatively, the DRAM chip 240 may comprise other numbers of memory banks 202, for example. In some embodiments, the DRAM chip 240 may include four or sixteen memory banks 202, as other examples. The substrate 236 also includes other circuitry formed thereon, such as global control (GC) circuitry 248 and clock synchronization circuitry 246. The substrate 236 may also include other active components or circuits, not shown, such as transistors, diodes, and conductive vias and conductive lines formed in conductive layers, as examples.

The substrate 236 has a first edge 238a and a second edge 238b opposed to the first edge 238a. The memory banks 202 are disposed at a surface of the semiconductor substrate 236 in the illustrated embodiment. In more advanced 3D integration techniques (e.g., through silicon via and beyond), the circuits and contacts may not be on the "surface" any longer. The present invention covers these embodiments as well.

The memory banks 202 may be arranged in two rows as shown in FIG. 4, with each row extending from the first edge 238a to the second edge 238b, for example. Each memory bank 202 includes a plurality of memory cells 204, e.g., millions of memory cells 204 or more, depending on the size of the DRAM chip 240. A plurality of wordlines (WL) and bitlines (BL) are formed substantially perpendicular to one another in conductive layers of the substrate 236 for accessing the memory cells 204, in the memory banks 202.

A plurality of data contacts 242a, e.g., for DQ signals, is disposed at the surface of the semiconductor substrate 236 between the first edge 238a of the substrate 236 and the memory banks 202. The data contacts 242a are disposed in a first contact region 244a proximate the first edge 238a. The data contacts 242a may comprise bond wire pads, for example, although alternatively, the input/output contacts 242a may comprise other types of connections, such as through silicon vias that extend from a top surface of the substrate 236 to a bottom surface of the substrate 236. The data contacts 242a may comprise contacts for data input and output (DQ) or data strobe (DQS) signals, as examples.

In this embodiment, the data contacts 242a are preferably input/output contacts, i.e., contacts in which signals travel both to and from the chip. In other embodiments, however, the data contacts 242a can include both input contacts and output contacts. As discussed below, in another embodiment, input contacts can be arranged along one edge of the chip while the output contacts are arranged along an opposite edge of the chip.

The clock synchronization circuitry 246, which is used to ensure that the DQS signal is fixed in time with respect to the system clock, is disposed at the surface of the semiconductor substrate 236 adjacent the first edge 238a. The clock synchronization circuitry preferably comprises a delay locked loop (DLL) but could also be implemented using a phase locked look (PLL), synchronous mirror delay or any other circuitry that accomplishes the intended purpose. Placing the clock synchronization circuitry 246 adjacent to the first edge will ensure the shortest path from the clock synchronization circuitry 246 to the respect DQS contact 242a. Since the majority of DDR DRAMs are organized by byte, meaning groups of eight input/output signals are driven by separate DQS signals, an added advantage could be obtained by placing the DLL at the mid-point of the input/output contacts. This will reduce the amount of DQS skew, by matching the distance each DQS must be routed.

A plurality of address and command contacts 242b are disposed at the surface of the semiconductor substrate 236 between the second edge 238b of the substrate 236 and the memory banks 202. The address and command contacts 242b are disposed in a second contact region 244b proximate the second edge 238b. The address and command contacts 242b may comprise bond wire pads, for example, although alternatively, the address and command contacts 242b may comprise other types of connections, such as through silicon vias. The address and command contacts 242b comprise contacts for commands, control signals, or timing signals, such as reset (RESET), clock (CK), chip select (CS), write enable (WE), and others commands, or addressing information (A) or bank addressing information (BA), as examples.

The global control circuitry 248 is disposed at the surface of the semiconductor substrate 236 adjacent the second edge 238b. Placing the global control circuitry 248 along the second edge will yield better input timing margins since the control circuitry 248 is reasonably close to the input command pads 242b. If the global control circuitry 248 is too far away from the second edge, it will require extra circuitry to maintain timing margins, which requires more area.

Figure 1:
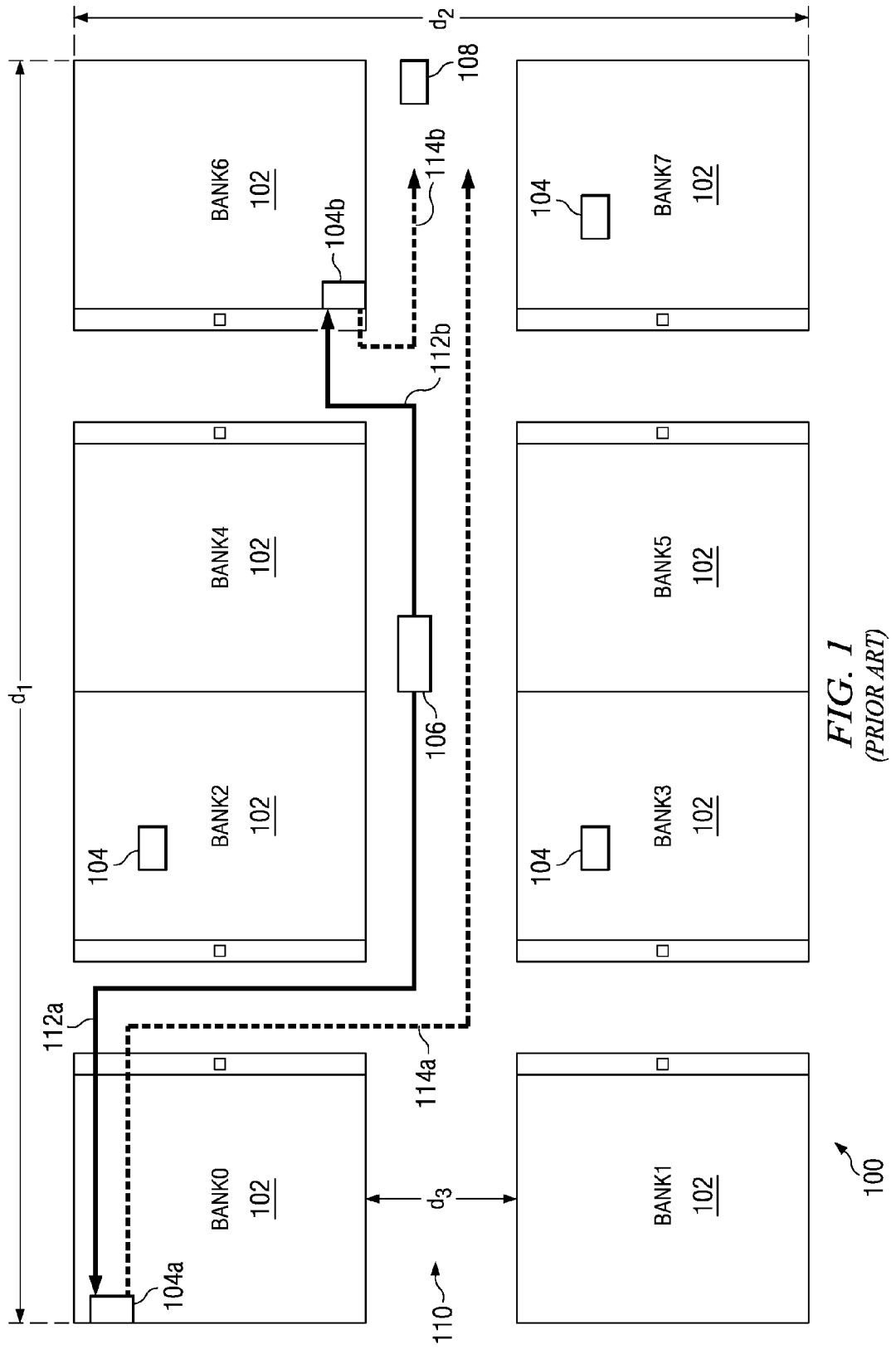
FIG. 1 is a drawing illustrating a top view of a known DRAM chip architecture.
Figure 2:
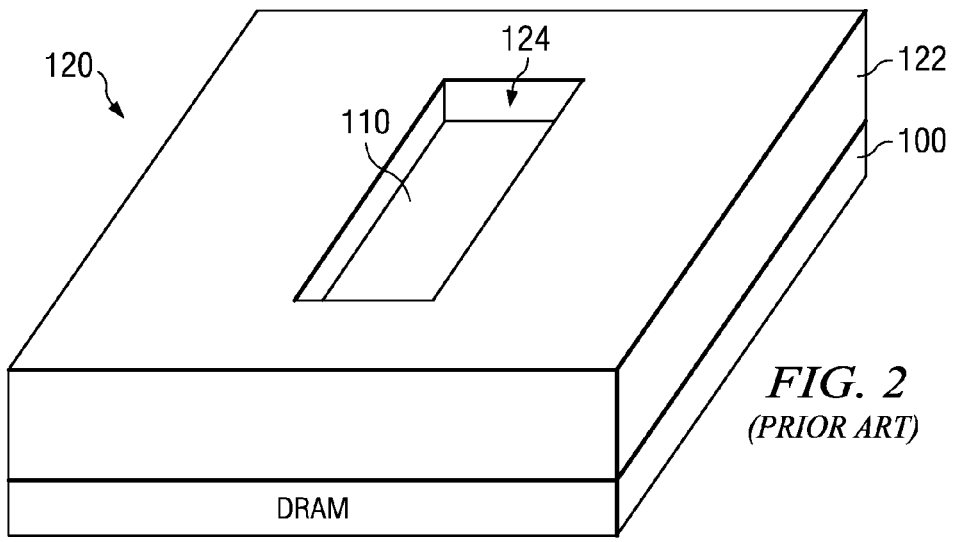
FIG. 2 is a perspective view of a known BOC packaging technique for a DRAM chip.
Figure 3:
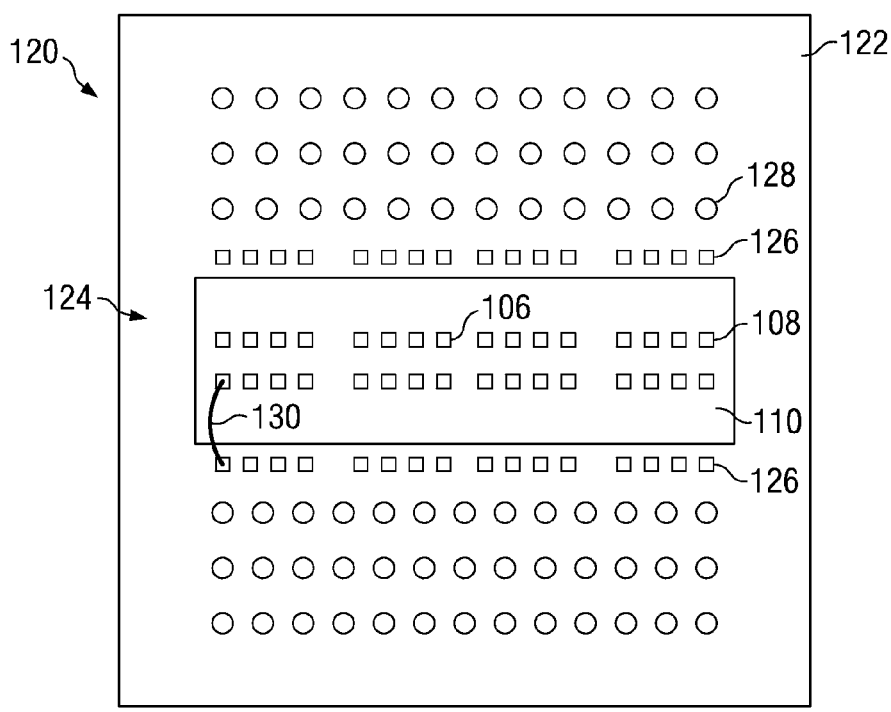
FIG. 3 is a top view of the BOC (board-on-chip) packaging technique for the DRAM chip shown in FIG. 2.

The first and second contact regions 244a and 244b comprise rectangular-shaped regions on the substrate 236 that the contacts 242a and 242b, respectively, are formed in. The contact regions 244a and 244b may comprise a width dimension $d_4$ of about 0.1-0.3 mm, as an example, although alternatively, dimension $d_4$ may comprise other values, depending on the application, the number of input/output contacts 242a and address and command contacts 242b, and/or the size of the DRAM chip 240, as examples. The contact regions 244a and 244b may comprise a dimension $d_4$ of about half the width dimension $d_3$ of a central spine 110 of a known DRAM chip 100 (see FIG. 1) in some embodiments.

Because the contacts 242a and 242b are positioned on the edges 238a and 238b of the DRAM chip 240, the worst case total access length of the memory device is decreased or minimized. For example, a worst case total access length is demonstrated by reading memory cell 204a in memory bank 202 of bank1, shown at the upper left edge of the substrate 236. A control signal 212a is sent from the global control circuitry 248 proximate the plurality of address and command contacts 242b at the second edge 238b to the memory cell 204a. The state of the cell 204a is read (e.g., a "0" or "1"), and the information is returned as a data signal 214a to the clock synchronization circuitry 246 at the first edge 238a of the DRAM chip 240. The length of the worst case total access length is (0.5*(the length of the DRAM chip 240 or dimension $d_1$)+(the height or dimension $d_2$ of the DRAM chip 240)+0.5*$d_1$), or ($d_1$+$d_2$).

A best case total access length of the DRAM chip 240 is demonstrated by reading memory cell 204b in memory bank 202 of bank4, which is a memory cell 204b disposed between the global control circuitry 248 and the clock synchronization circuitry 246. A control signal 212b is sent from the global control circuitry 248 to the memory cell 204b. The state of the memory cell 204b is read, and the information is returned as a data signal 214b to the clock synchronization circuitry 246 at the first edge 238a of the DRAM chip 240. The best case access length is dimension $d_2$, the height of the DRAM chip 240. Thus, the difference between the best and worst case total access lengths is dimension $d_1$, which is a large reduction in the difference between the worst and best case total access length, advantageously.

Advantageously, positioning the input/output contacts 242a and clock synchronization circuitry 246 at a first edge 238a and positioning the address and command contacts 242b and global control circuitry 248 at a second edge 238b opposite the first edge 238a provides a highly efficient architecture for a DRAM chip 240 wherein the worst and best case total access lengths are optimized. Thus, the DRAM chip 240 comprises a high-speed memory device with a large bandwidth. Furthermore, stub lengths of portions of the packaging used for the DRAM chip 240 are also minimized or optimized, to be described further herein.

In the embodiment discussed above, the contacts 242a are preferably data input/output contacts. In another embodiment, the contacts 242a can include all the data input contacts while the contacts 242b can include all the data output contacts. In other words, the device could have unidirectional data input and unidirectional data output contacts. As discussed above, the data input contacts could be on the same edge as the data output contacts. It may be more preferred, however, that the data input contacts be on the same edge as the command/address contacts. In other words, contacts 242a include both the data input contacts and the command/address contacts, while contacts 242b include the data output contacts.

Figure 5:
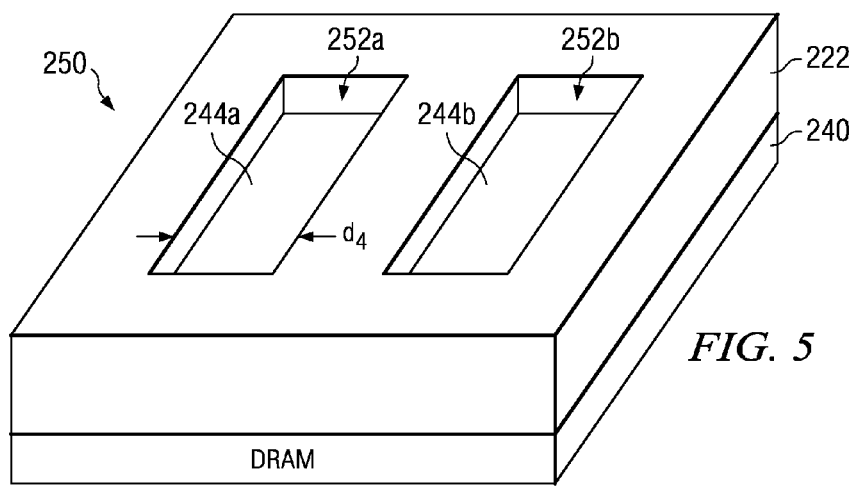
FIG. 5 shows a perspective view of packaging techniques for a DRAM chip in accordance with several embodiments of the present invention.
Figure 6:
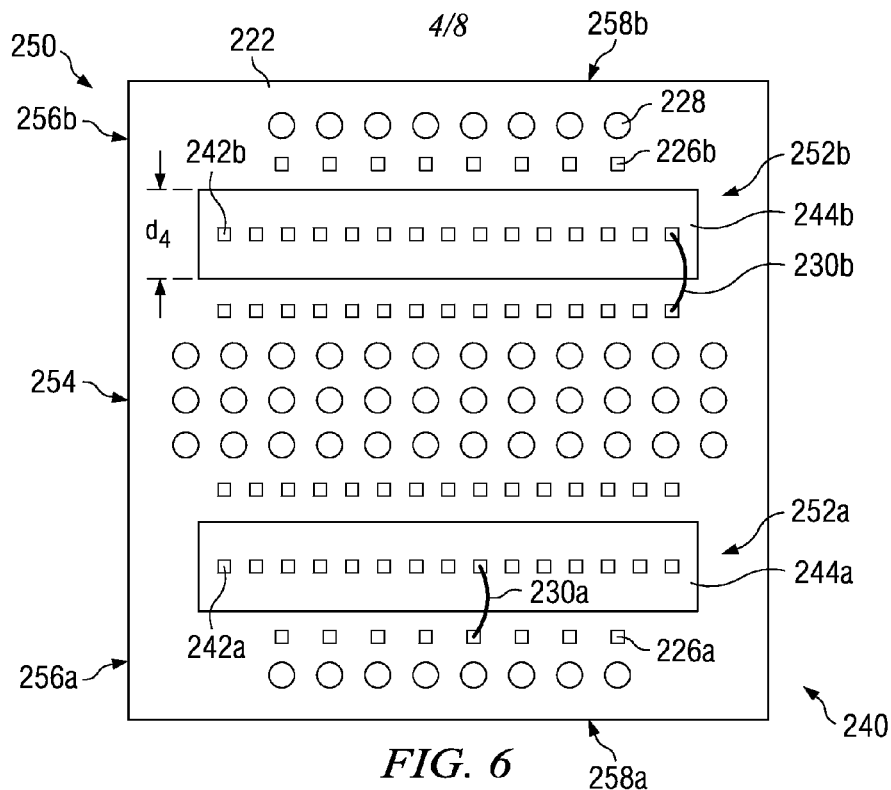
FIG. 6 is a top view of a packaging technique for a DRAM chip in accordance with one embodiment of the present invention.
Figure 7:
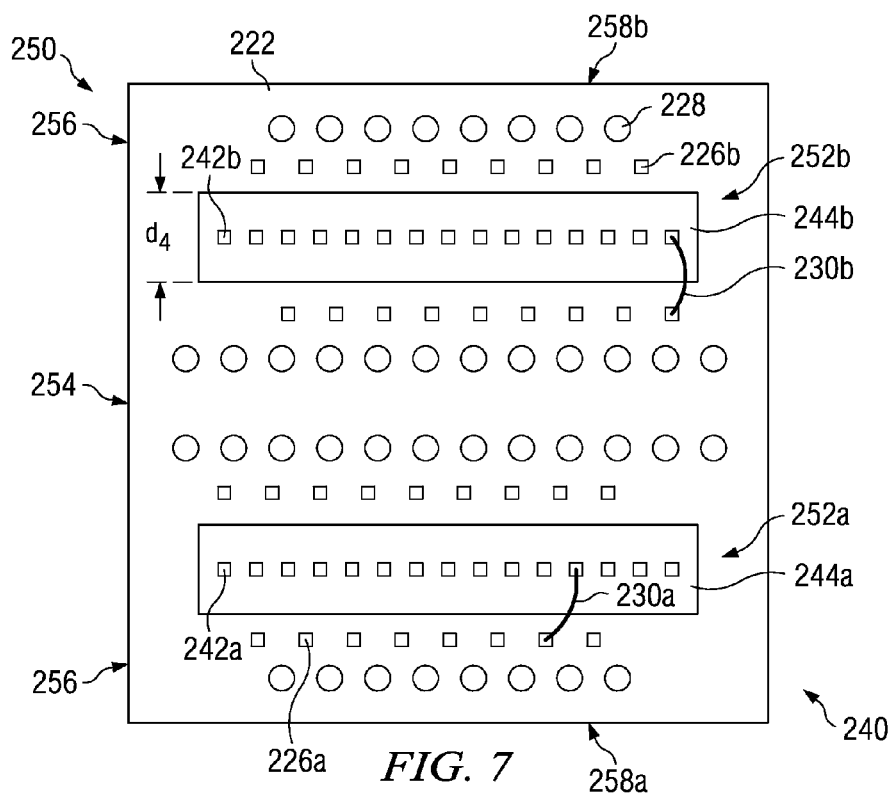
FIG. 7 is a top view of a packaging technique for a DRAM chip in accordance with another embodiment of the present invention.
Figure 10:
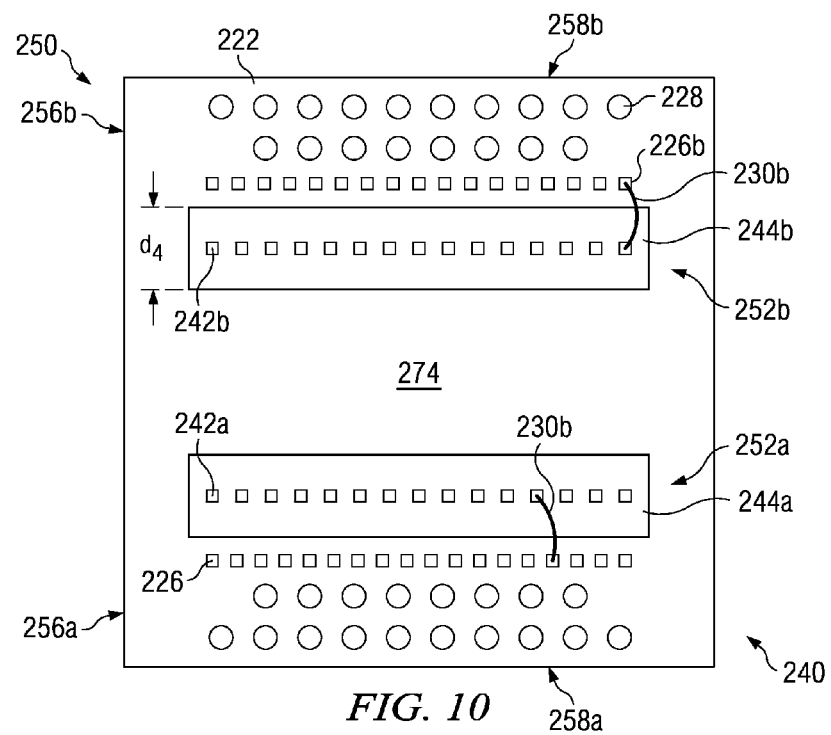
FIG. 10 is a top view of a packaging technique for a DRAM chip in accordance with yet another embodiment of the present invention.

FIG. 5 shows a perspective view of a packaged DRAM chip 250, illustrating packaging techniques for a DRAM chip 240 of FIG. 4 in accordance with embodiments of the present invention. Top views of various embodiments of packaged DRAM chips 250 are shown in FIGS. 6, 7, and 10. The packaging techniques comprise board-on-chip (BOC) packaging with a modified substrate 222 having two slots. A first slot 252a and a second slot 252b extend through the substrate 222, wherein the second slot 252b is substantially parallel to the first slot 252a. The slots 252a and 252b in the substrate 222 comprise apertures or holes in the substrate 222 material that are adapted to be positioned over the contact regions 244a and 244b, respectively. The slots 252a and 252b may comprise a width or dimension $d_4$ that is substantially the same as the width $d_4$ of the contact regions 244a and 244b, respectively, for example. Alternatively, the slots 252a and 252b may comprise a different width than the width $d_4$ of the contact regions 244a and 244b.

The DRAM chip 240 is bonded or adhered to the substrate 222 with the contacts 244a and 244b facing toward the substrate 222, e.g., face down on a top surface of the substrate 222, so that the contacts 244a and 244b may be wire bonded to in order to make electrical connections to bond pads 226a and 226b, respectively, on the substrate 222.

FIG. 6 is a top view of a packaging technique for a DRAM chip 240 in accordance with an embodiment of the present invention. A packaged DRAM chip 250 is shown, wherein the substrate 222 is disposed over the DRAM chip 240. The DRAM chip 240 is attached face down on a top surface of the substrate 222 (although the view in FIG. 6 shows the DRAM chip 240 positioned face up). The substrate 222 comprises an insulating material such as plastic, ceramic, or other dielectric materials, for example. The substrate 222 comprises a substantially rigid, supportive material.

The first slot 252a in the substrate 222 is aligned with the first contact region 244a so that the first plurality of contact pads 242a are exposed, providing access to the input/output contacts 242a. Likewise, the second slot 252b in the substrate 222 is aligned with the second plurality of contact pads 242b in the second contact region 244b.

A plurality of bond pads 226a is disposed on the substrate 222 proximate the edges of the first slot 252a, and a plurality of bond pads 226b is disposed on the substrate 222 proximate the edges of the second slot 252b. The plurality of bond pads 226a comprise contact pads that are associated with the first plurality of contact pads 242a and are electrically connected to the associated first plurality of contact pads 242a by electrical conductors such as bond wires that extend through the first slot 252a. Likewise, the plurality of bond pads 226b comprises contact pads that are associated with the second plurality of contact pads 242b and are electrically connected to the associated second plurality of contact pads 242b by electrical conductors that extend through the second slot 252b. For example, bond wires 230a may be bonded to the input/output contacts 242a and bond pads 226a, and bond wires 230b may be bonded to the address and command contacts 242b and bond pads 226b to provide electrical connection of the DRAM chip 240 to the substrate 222, as shown.

The substrate 222 comprises a plurality of external connectors 228 disposed on the bottom surface which may be used to attach the packaged DRAM device 250 to a circuit board such as a DIMM, other types of memory modules, or to a package, e.g., in a multi-chip module. Each of the external connectors is coupled to a corresponding contact pad 226a or 226b of the substrate 222. The external connectors 228 may comprise solder balls, for example, although alternatively, the external connectors may comprise other types of connections, such as pins or other conductive elements. The bond wires 230a and 230b, contacts 242a and 242b, and bond pads 226a and 226b may be covered with an insulating, encapsulating material (not shown) before soldering the solder balls 228 to a package, for example. For purposes of discussion, the external connectors 228 are also referred to herein as solder balls 228.

A first edge region 256a of solder balls 228 is disposed proximate the first slot 252a. The first edge region 256a of solder balls 228 comprises a first group of solder balls 228 located between the first slot 252a and the first edge 258a of the substrate 222. A center region 254 of solder balls 228 is disposed between the first slot 252a and the second slot 252b. The center region 254 of solder balls 228 comprises a second group of solder balls 228 located between the first slot 252a and the second slot 252b. The second edge region 256b of solder balls 228 is disposed proximate the second slot 252b. The second edge region 256b of solder balls 228 comprises a third group of solder balls 228 located between the second slot 252b and the second edge 258b of the substrate 222.

Etch runs (not shown) are formed in or on the substrate 222 to provide electrical connection between the solder balls 228 and the bond pads 226a and 226b. The etch runs comprise stubs or conductive lines of metal or other conductive material. Advantageously, the stub length is minimized in accordance with embodiments of the present invention, because the distance between the bond pads 226a and 226b and the solder balls 228 is minimized due to the presence of the two slots 252a and 252b, due to the grouping of the input/output contacts 242a within the first slot 252a, and due to the grouping of the address and command contacts 242b within the second slot 252b, as examples.

In some embodiments, all of the input/output contacts 242a of the DRAM chip 240 are grouped together and are positioned in the first contact region 244a proximate the first slot 252a, and all of the command contacts and/or address contacts 242b of the DRAM chip 240 are grouped together in the second contact region 244b proximate the second slot 252b, for example.

Only one row of solder balls 228 is shown within each edge region 256a and 256b; alternatively, two or more rows of solder balls 228 may be included in the edge regions 256a and 256b of the substrate 222. Only three rows of solder balls 228 are shown in the center region 254 in FIG. 6; alternatively, four or more rows of solder balls 228 may be included in the center region 254 of the substrate 222, in this embodiment.

FIG. 7 is a top view of a packaging technique for a DRAM chip 240 in accordance with another embodiment of the present invention. A packaged DRAM device 250 is shown wherein the center region 254 of solder balls 228 comprises a central region midway between the first slot 252a and second slot 252b that contains no solder balls 228. The stub length is further minimized in this embodiment, because a portion of the central region 254 does not contain solder balls 228.

The substrate 222 may comprise a single row of solder balls 228 on either side of the first slot 252a and the second slot 252b, as shown in FIG. 7. This is advantageous because the stub length of conductive lines between the bond pads 226a and the solder balls 228 and between the bond pads 226b and the solder balls 228 is substantially the same for every bond bad 226a and 226b of the substrate 222. Alternatively, two or more rows of solder balls 228 may be disposed on either side of the first slot 252a and the second slot 252b, for example.

Figure 8:
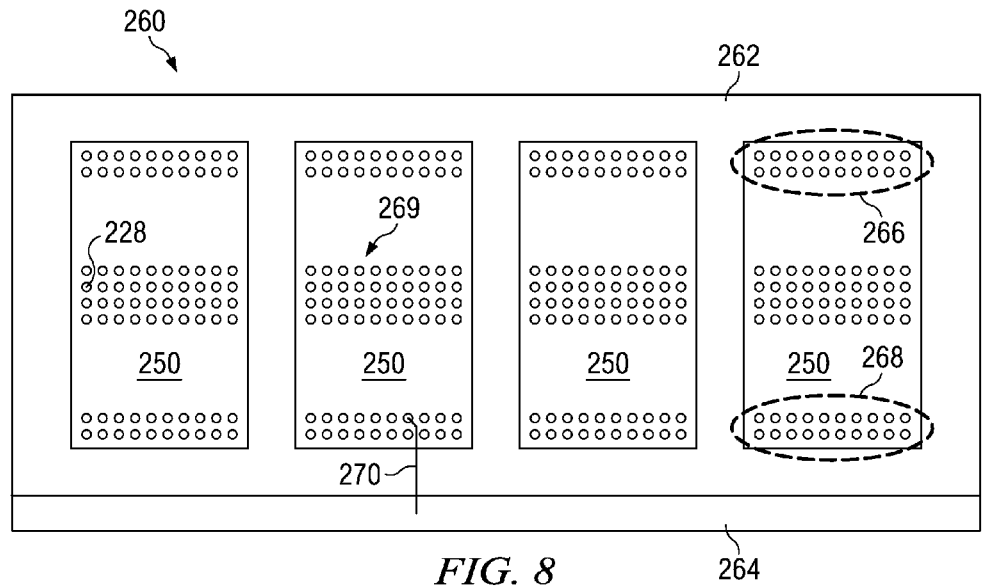
FIG. 8 is a top view of a packaged DRAM chip of FIG. 6 implemented in a dual in-line memory module (DIMM)

Embodiments of the present invention include memory modules that include the novel memory devices and DRAM chips 240 described herein. As one example, the packaged DRAM chips 250 shown in FIGS. 6 and 7 may be implemented in a DIMM 260, as shown in FIG. 8. The DIMM 260 includes a circuit board 262 and a connector 264 disposed on one edge. The packaged DRAM devices 250 are mounted on the circuit board 262 and are soldered to the DIMM 260 using the solder balls 228. In FIG. 8, a layout for solder balls 228 of packaged DRAM chips 250 of FIG. 6 is shown, wherein solder balls 228 are included in the center regions 254 of the packaged DRAM chips 250, for example.

The DIMM 260 is illustrated with four packaged DRAM chips 250 on one side. Packaged DRAM chips 250 can also be provided on the opposite side. A typical DIMM 260 might include 16 or 18 packaged DRAM chips 250. In other embodiments, a DIMM or other types of memory modules can include other numbers of packaged DRAM chips 250, depending on the application, for example.

Regions 256a, 254, and 256b of the solder balls 228 of the packaged DRAM chips 250 provide different types of interface regions of the DIMM 260 in accordance with embodiments of the present invention. For example, the top region 256b of solder balls 228 that is coupled to the DRAM address and command contacts 242b comprises a command/address bus interface region 266 for the DIMM 260, and the bottom region 256a of solder balls 228 that is coupled to the DRAM input/output contacts 242a comprises a data bus signal interface region 268 of the DIMM 260. The center region 254 of solder balls 228 may be coupled to power input contacts and may comprise a voltage supply and return region 269, for example. The solder balls 228 may be soldered to the circuit board 262, and wiring in the circuit board 262 is used to connect the solder balls 228 to the edge connector 264. For example, wiring for a data bus signal is shown at 270 in FIG. 8.

FIG. 9 illustrates a ballout 272 for solder balls of the packaged DRAM chips 250 disposed on a DIMM 260 such as the one shown in FIG. 8. The drawing shows a ballout 272 for solder balls 228 on a substrate 222 of a packaged DRAM chip 250 shown in FIG. 7, wherein solder balls 228 are not included in a portion of the center region 254 of the packaged DRAM chip 250, e.g., at rows C, E, F, G, and J of the ballout 272. The ballout 272 is a chart or grid indicating which signals, commands, or voltages are assigned to each solder ball 228. The ballout 272 is one example of a possible configuration; alternatively, the ballout 272 may comprise other arrangements of the various signals, power inputs, and data input/output, for example.

Solder balls 228 connected to address contacts such as A13, A9, and A2 and command contacts such as /RESET, /WE, and /CAS are included in the command/address bus interface region 266 of the DIMM 260, as shown in rows A and B in FIG. 9. Solder balls 228 connected to input and output contacts such as DQL0, DQSL, and DQL2 are included in the data bus signal interface region 268, as shown in rows K and L. Some solder balls 228 connected to power input or voltage supply contacts such as $V_{DD}$ and $V_{SS}$ may also be included in the data bus signal interface region 268. Solder balls 228 connected to power input or voltage supply contacts such $V_{SS}$ and $V_{DD}$ may be included in the voltage supply and return region 269. Solder balls 228 connected to some address or command contacts may also be included in the voltage supply and voltage return region 269 if needed, as shown at D-6 (CS1bar) and D-11 (A10/AP), for example.

FIG. 10 is a top view of a packaging technique for a DRAM chip 240 (see FIG. 4) in accordance with yet another embodiment of the present invention. The packaged DRAM chip 250 comprises a BOC, wherein a central region 274 of the substrate 222 has no solder balls 228. This embodiment is advantageous in applications where heating of the DRAM chip 240 in the central region 274 may be a problem, for example. Placing the solder balls 228 only at the edge regions 256a and 256b avoids the need to have the chip overlying any balls since heat from the chip may cause thermal stresses in the underlying substrate. Further there may be no need to provide wiring in the substrate 222 beneath the DRAM chip 240, thus avoiding running current beneath the DRAM chip 240, which may increase the temperature. All of the solder balls 228 are placed at the edge regions 256a and 256b in this embodiment, resulting in a footprint of external connectors such as solder balls 228 only at the edges of the packaged DRAM chip 250.

For example, the solder balls 228 are arranged in only two groups in the embodiment shown in FIG. 10. The first edge region 256a comprises a first group of solder balls 228 adjacent the first edge 238a (not shown in FIG. 10; see FIG. 4) of the DRAM chip 240, e.g., adjacent the first edge region 258a of the substrate 222. The second edge region 256b comprises a second group of solder balls 228 adjacent the second edge 238b of the DRAM chip 240, e.g., adjacent the second edge region 258b of the substrate 222.

Figure 11:
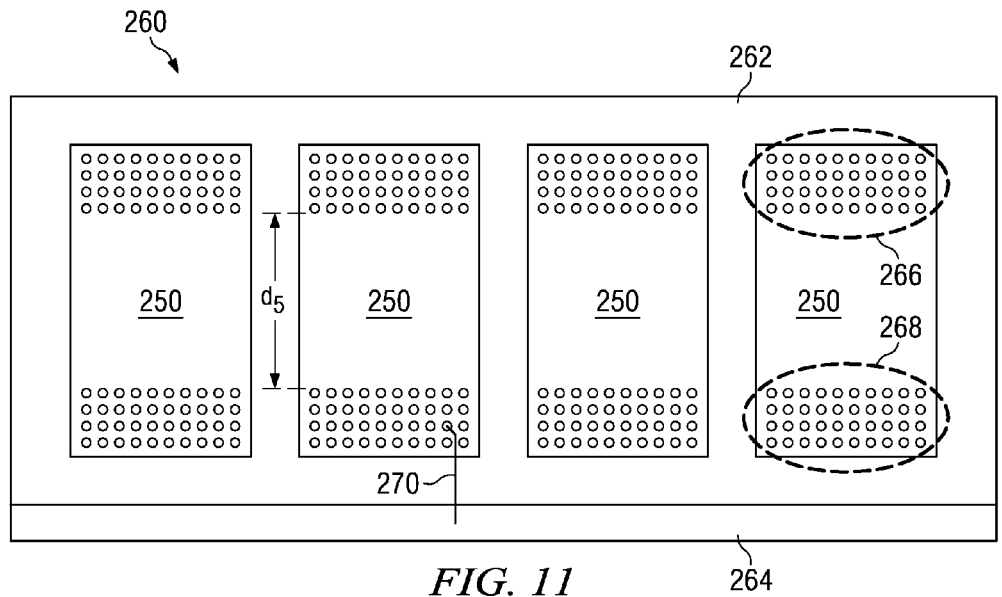
FIG. 11 is a top view of a DIMM implementing packaged DRAM chips of FIG. 10.

FIG. 11 is a top view of a DIMM 260 implementing packaged DRAM chips 250 of FIG. 10. The packaged DRAM chips 250 may comprise a dimension $d_5$ between the solder ball regions of about 10 to 15 mm, as an example. Alternatively, the packaged DRAM chips 250 may comprise a smaller dimension $d_5$, e.g., comprising about 10 mm or less, in DRAM applications having a higher density. Embodiments of the present invention may be implemented in high or low density DIMMs 260 and DRAM chips 240, for example.

FIG. 12 is a drawing illustrating a ballout 272 for the packaged DRAM chips 250 of the DIMM 260 shown in FIG. 11. Solder balls 228 connected to the address and command contacts 242b are included in the command/address bus interface region 266 of the DIMM 260. Solder balls 228 connected to some power input or voltage supply contacts such as $V_{DD}$ and $V_{SS}$ may be included in the command/address bus interface region 266, as shown. Solder balls 228 connected to the input/output contacts 242a are included in the data bus signal interface region 268. Solder balls 228 connected to some voltage supply contacts such as $V_{DD}$ and $V_{SS}$ may also be included in the data bus signal interface region 268, also shown.

Figure 13:
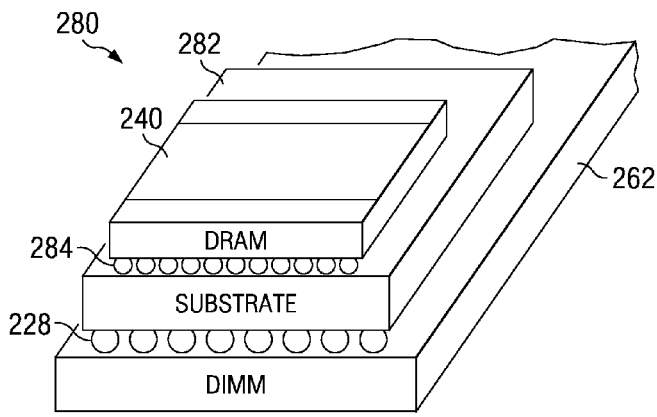
FIG. 13 shows a packaging technique for a DRAM chip in accordance with another embodiment of the present invention.

FIG. 13 shows a packaging technique 280 for a DRAM chip 240 in accordance with another embodiment of the present invention. The DRAM chip 240 is packaged using chip scale packaging in this embodiment. Rather than electrically coupling the DRAM chip 240 to a substrate using bond wires through slots 252a and 252b in the substrate 222 as in the previous embodiment, a substrate 282 is used that does not include slots. The DRAM chip 240 comprises through silicon vias (not shown) that are bonded to the underlying substrate 282 using solder 284. The through silicon vias are located in the same regions 244a and 244b and have substantially the same pattern as the contact pads 242a and 242b in the embodiments previously described herein, for example.

Alternatively, the chip 240 can include a redistribution layer, which routes the contacts 242 from the edges to the center portion of the chip, which includes contact regions (not shown). Each of the contact regions can be provided with solder or another connector, such as a compliant bump as disclosed in U.S. Pat. No. 6,897,568, as an example. These contact regions would then be connected to a similar pattern of regions on the substrate 282.

Figure 14:
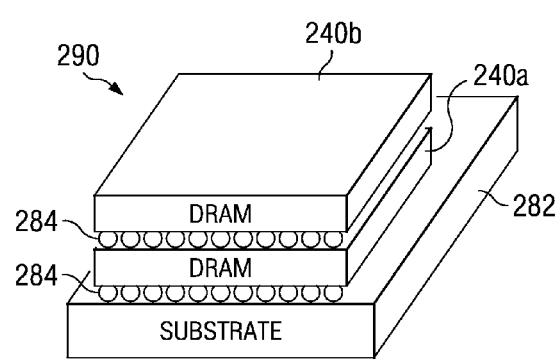
FIG. 14 shows a packaging technique for a DRAM chip in accordance with yet another embodiment of the present invention.

FIG. 14 shows a packaging technique 290 for a DRAM chip in accordance with yet another embodiment of the present invention. One or more DRAM chips 240a and 240b may be stacked together in accordance with embodiments of the present invention and electrically coupled together using solder 284. The DRAM chips 240a and 240b also comprise through silicon vias or other contacts as discussed above in this embodiment. DRAM chip 240a may comprise a first memory chip, and DRAM chip 240b may comprise a second memory chip. The second memory chip 240b is disposed over, e.g., mounted over the first memory chip 240a, and is electrically coupled to the second memory chip 240b while the first memory chip 240a is coupled to or mounted over the substrate 282. The first and second memory chips 240a and 240b may be encapsulated in a common encapsulant comprising a protective insulating material, for example, not shown. More layers of memory chips 240 could further be included.

In the embodiments shown in FIGS. 13 and 14, bond wires may alternatively be used for making the electrical connections, rather than solder 284 or solder balls 228, for example, not shown. In that case, the chip 240 could be mounted face up so wire bonds could be connected to the top surface of the substrate 282. A spacer (not shown) can be included between chips 240a and 240b to provide access to the contact pads of the lower chip.

In the embodiments shown in FIGS. 13 and 14, the footprint for the contact pads 242a and 242b of the DRAM chips 240 may comprise the configurations described for the embodiments shown in FIGS. 4 through 12. Likewise, the footprint for the external connectors 228 of the substrate 282 may comprise the configurations described for the embodiments shown in FIGS. 6, 7, and 10.

In an alternate embodiment, the DRAM chips 240 can be mounted directly onto the board 262, i.e., without intervening substrate 282. In other words, unpackaged DRAM chips can be utilized in embodiments of the invention. The electrical connection between the PCB 282 and the semiconductor chip 240 would then be done directly, e.g., without a package in between. Any of the connection techniques discussed herein can be used with the unpackaged chip. Similarly, the chip stacking illustrated in FIG. 14 can be used with unpackaged chips 240.

Note that in the embodiments shown in FIGS. 4 through 14, the external connectors or solder balls 228 of the substrates 222 or 282 may be arranged in a pattern in accordance with a JEDEC standard. The external connectors 228 may be arranged in accordance with a JEDEC DDR3 standard, as one example, although other standards such as DDR2 can also be used.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A memory device comprising:
   a semiconductor substrate having a first edge and a second edge opposed to the first edge;
   a plurality of memory banks disposed at a central portion of the semiconductor substrate, each memory bank including a plurality of memory cells;
   a plurality of data contacts disposed between the first edge and all memory banks;
   delay lock loop circuitry disposed adjacent the first edge; and
   a plurality of address and command contacts disposed between the second edge and all memory banks.

2. The device of claim 1, wherein the memory cells comprise dynamic random access memory cells.

3. The device of claim 2, wherein the plurality of memory banks includes four memory banks.

4. The device of claim 3, wherein the plurality of memory banks includes eight memory banks.

5. The device of claim 4, wherein the plurality of memory banks includes eight memory banks arranged in two rows, each row extending from the first edge to the second edge.

6. The device of claim 5, wherein each row extends parallel to a third edge that is perpendicular to the first edge and the second edge, the third edge being longer than both the first edge and the second edge.

7. The device of claim 1, wherein the data contacts and the address and command contacts comprise bond wire pads.

8. The device of claim 1, wherein the data contacts and the address and command contacts comprise through silicon vias.

9. The device of claim 1, wherein the data contacts comprise input/output contacts.

10. The device of claim 1, further comprising global control circuitry disposed adjacent the second edge.

11. The device of claim 1, further comprising:
    a second memory chip including a plurality of memory cells, a third plurality of contacts adjacent a first edge of the second memory chip and a fourth plurality of contacts adjacent a second edge of the second memory chip such that no memory cells are between the plurality of data contacts and the first edge or between the plurality of address and command contacts and the second edge; and
    electrical connections between ones of data contacts and the third plurality of contacts and between ones of the address and command contacts and the fourth plurality of contacts.

12. A memory device comprising:
    a semiconductor substrate having a first edge and a second edge opposed to the first edge;
    a plurality of memory banks disposed at a central portion of the semiconductor substrate between the first edge and the second edge, each memory bank including a plurality of memory cells;
    delay locked loop circuitry disposed adjacent the first edge;
    a plurality of data input contacts, all data input contacts being disposed between the first edge and all memory banks; and
    a plurality of data output contacts, all data output contacts being disposed between the second edge and all the memory banks.

13. The device of claim 12, further comprising a plurality of address and command contacts.

14. The device of claim 13, wherein all address and command contacts are disposed between the first edge and all memory banks.

15. A memory device comprising:
    a memory chip including a plurality of memory banks disposed at a central portion of the memory chip, each memory bank including a plurality of memory cells, a plurality of data contact pads between a first edge of the memory chip and all memory banks, delay lock loop circuitry adjacent the first edge of the memory chip, and a plurality of address and command contact pads between a second edge of the memory chip and all memory banks, the second edge opposed to the first edge; and
    a substrate including a first slot and a second slot that extend through the substrate;
    wherein the memory chip is attached face down on a top surface of the substrate such that the plurality of data contact pads is aligned with the first slot and the plurality of address and command contact pads is aligned with the second slot, data contact pads being electrically connected to associated contact pads of the substrate by electrical conductors that extend through the first slot and address and command contact pads being electrically connected to associated contact pads of the substrate by electrical conductors that extend through the second slot.

16. The device of claim 15, wherein, all data contact pads of the memory chip are between the first edge of the memory chip and all memory banks and all address contact pads of the memory chip are between the second edge of the memory chip and all memory banks.

17. The device of claim 15, wherein, all data contact pads of the memory chip are between the first edge of the memory chip and all memory banks and all command contact pads of the memory chip are between the second edge of the memory chip and all memory banks.

18. The device of claim 15, wherein the memory chip includes a plurality of data contact pads, a plurality of command contact pads and a plurality of address contact pads, all of the data contact pads of the memory chip are between the first edge of the memory chip and all memory banks and all of the address contact pads and command contact pads of the memory chip are between the second edge of the memory chip and all memory banks.

19. The device of claim 15, wherein the substrate further includes a plurality of external connectors disposed on a bottom surface that is opposite the top surface, each of the external connectors coupled to a corresponding contact pad of the substrate.

20. The device of claim 19, wherein the external connectors comprise solder balls.

21. The device of claim 19, wherein the external connectors are arranged in only two groups, one group being adjacent the first edge of the memory chip and the other group adjacent the second edge of the memory chip.

22. The device of claim 19, wherein the external connectors are arranged in a first group located between the first slot and a first edge of the substrate, a second group located between the first slot and the second slot and a third group located between the second slot and a second edge of the substrate, the first edge of the substrate being adjacent the first edge of the memory chip and the second edge of the substrate being adjacent the second edge of the memory chip.

23. The device of claim 15, further comprising a second memory chip disposed over the memory chip, wherein the memory chip and second memory chip are encapsulated in a common encapsulant.

24. A memory module comprising:

a circuit board; and a plurality of memory devices mounted on the circuit board, each memory device comprising a memory device in accordance with claim 1.

25. The memory module of claim 24, wherein the memory devices comprise packaged devices.

26. The memory module of claim 24, wherein the memory devices comprise unpackaged dies.

27. A memory module comprising:

a circuit board; and a plurality of memory devices mounted on the circuit board, each memory device comprising a memory device in accordance with claim 12.

28. A method of making a memory device, the method comprising:

providing a memory chip including a plurality of memory banks disposed at a central portion of the semiconductor substrate, each memory bank including a plurality of memory cells, a plurality of data contact pads disposed between a first edge of the memory chip and all memory banks, delay lock loop circuitry disposed adjacent the first edge; and a plurality of address and command contact pads disposed between a second edge of the memory chip and all memory banks;

providing a substrate including a first slot and a second slot that extend through the substrate;

attaching the memory chip face down over a top surface of the substrate such that the data contact pads are aligned with the first slot and the address and command contact pads are aligned with the second slot; and electrically connecting data contact pads to associated contact pads of the substrate by electrical conductors that extend through the first slot and electrically connecting address and command contact pads to associated contact pads of the substrate by electrical conductors that extend through the second slot.

29. The method of claim 28, wherein electrically connecting comprises wire bonding.

30. The method of claim 28, wherein all data contact pads of the memory chip are between the first edge of the memory chip and all memory banks and all address and command contact pads of the memory chip are between the second edge of the memory chip and all memory banks.

* * * * *